Nov. 1, 1960 J. A. GITHENS 2,958,788

TRANSISTOR DELAY CIRCUITS

Filed June 11, 1956 2 Sheets-Sheet 1

INVENTOR
J. A. GITHENS
BY Alan C. Rose
ATTORNEY

INVENTOR
J. A. GITHENS
BY Alan C. Rose
ATTORNEY

United States Patent Office 2,958,788

Patented Nov. 1, 1960

2,958,788

TRANSISTOR DELAY CIRCUITS

John A. Githens, Morristown, N.J., assignor to Bell Telephone Laboratories, Incorporated, New York, N.Y., a corporation of New York Filed June 11, 1956, Ser. No. 590,554

9 Claims. (Cl. 307—88.5)

This invention relates to direct coupled transistor circuits, and more particularly to control circuits requiring the introduction of relatively brief periods of delay.

In the binary computer field, a technology has been developed in which only transistors and resistors need be employed. This technology is termed "Direct Coupled Transistor Logic" circuitry, and is often abbreviated to the initials "D.C.T.L." The transistors in such circuits characteristically are arranged in circuit configurations with all or most of the emitters connected to a common point such as ground, and each transistor normally has its base connected to the collector of the preceding transistor. The characteristics of the transistors employed in D.C.T.L. circuits are such that they are de-energized when the input circuit to the base is grounded (in addition to the grounded emitter), or even when the base is brought close to ground potential. In addition, when the transistors are energized, the collector-to-emitter impedance is so low that the voltage at the collector is reduced almost to the ground potential of the emitter. Therefore, when one transistor is energized, the transistor or transistors coupled to it are de-energized. Similarly, when a transistor is de-energized, the transistors coupled to it are energized. Other details involved in the fundamental D.C.T.L. circuits are disclosed in an article by R. H. Beter et al. which appeared at pages 139 through 145 of part 4 of the 1955 Institute of Radio Engineers Convention Record.

One object of the present invention is to obtain short term delay in direct coupled transistor logic circuits using only resistors and transistors.

A more specific object is to convert an input signal of indeterminate length into a pulse of short duration suitable for use in a computer.

In accordance with the invention, two branch control circuits are energized by a single input circuit in a direct coupled transistor logic circuit. In addition, means are provided for significantly delaying the de-energization of at least one transistor in one of the branch control circuits. In one illustrative embodiment of the invention, the delay is introduced by saturating a transistor in one of the branch control circuits to a greater extent than any transistors in the other control circuit. This can be accomplished by increasing the base current or by reducing the collector current. The de-energization of transistors in D.C.T.L. circuits may also be delayed by inserting a resistance between the collector of one transistor and the base of the next following transistor.

Other objects and various advantages and features of the invention may be readily apprehended by reference to the following description taken in connection with the appended claims and the accompanying drawings.

Figure 1:
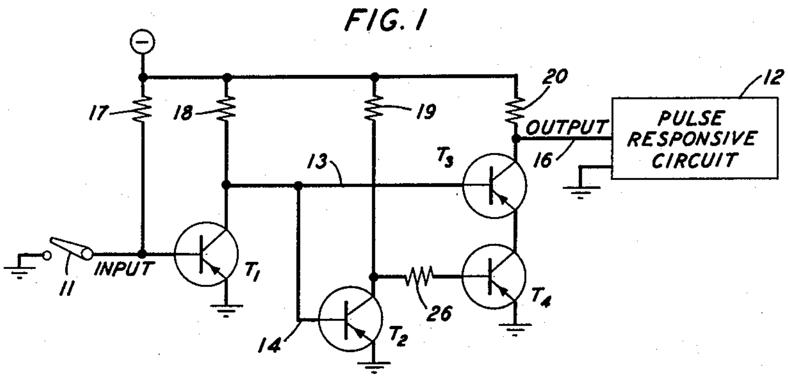
Fig. 1 is a schematic diagram of a transistor circuit in accordance with the invention for converting pulses of an indeterminate length into relatively brief pulses.

With reference to the drawings, Fig. 1 shows an illustrative direct coupled transistor circuit in accordance with the invention. More specifically, the circuit of Fig. 1 converts signals of indeterminate duration supplied by the switch 11 into short pulses which may be employed, for example, to control the pulse responsive circuit 12.

The pulse circuit of Fig. 1 includes four transistors $T_1$ through $T_4$ which may, for example, be junction transistors of the PNP type. The collector of the input transistor $T_1$ is connected to the fast and slow branch circuits 13 and 14, respectively. Transistor $T_2$ is located in the slow acting branch circuit 14. The two transistors $T_3$ and $T_4$ are the output components for the fast and slow acting branch circuits 13 and 14.

Transistors $T_3$ and $T_4$ also form an AND gate. More specifically, when negative voltages are applied to the bases of both transistors, the transistors are energized, the collector-to-emitter impedance is greatly reduced, and the output lead 16 drops nearly to ground potential. When either or both of the transistors $T_3$ and $T_4$ are de-energized, however, the voltage at output lead 16 drops to a substantial negative value.

Four resistors 17 through 20 are provided to connect the negative supply voltage to the transistors $T_1$ through $T_4$. The resistor 17 supplies base-to-emitter biasing current to the transistor $T_1$. The resistor 18 supplies collector voltage to the transistor $T_1$, and supplies current to the bases of transistors $T_2$ and $T_3$. The resistor 19 is similarly connected to the collector of transistor $T_2$, and supplies base-to-emitter current through resistor 26 to transistor $T_4$. Load resistor 20 is connected between the negative voltage supply and the collector of the upper transistor $T_3$ of the AND circuit formed by the transistors $T_3$ and $T_4$.

In the normal condition before switch 11 is closed, tranisistor $T_1$ is energized, transistors $T_2$ and $T_3$ are de-energized, and transistor $T_4$ is enabled. No collector current can flow in transistor $T_4$, however, because the collector of transistor $T_4$ is in series with the emitter of the de-energized transistor $T_3$.

Figure 2:
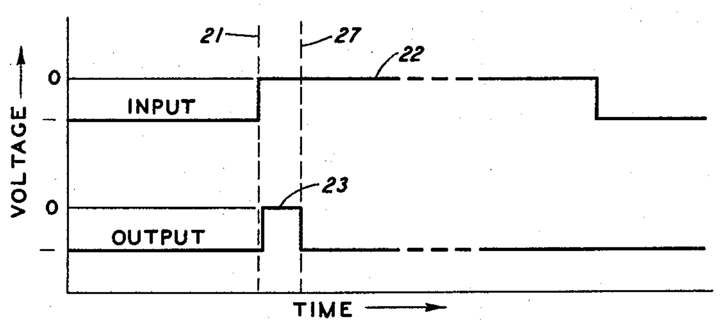
Fig. 2 is a graph indicating the input and output wave forms of the circuit of Fig. 1.

When the manual switch 11 is closed, transistor $T_1$ is turned off and negative enabling voltages are applied to the bases of transistors $T_2$ and $T_3$. The instant of closure of switch 11 is indicated in Fig. 2 by the dashed line 21.

The transistor $T_3$ is energized promptly on the closure of switch 11, as indicated by the proximity of the left-hand edge of the pulse 22 to the dashed line 21. In the normal condition when the switch 11 is open, the output lead 16 is maintained at a substantial negative voltage. At the instant that transistor $T_3$ is turned on, however, the AND gate including transistors $T_3$ and $T_4$ short-circuits the output lead 16 to ground. This is indicated by the rise of the left-hand edge of pulse 23 from a negative voltage level to ground potential in Fig. 2.

Transistor $T_2$ is energized concurrently with transistor $T_3$. The energization of transistor $T_3$ closes the collector circuit of the enabled transistor $T_4$, and therefore energizes it. The energization of transistor $T_2$ short-circuits the left-hand end of resistor 26 to ground. In the absence of resistor 26, transistor $T_4$ would be disabled promptly upon the energization of transistor $T_2$. The addition of resistance 26, however, increases the base resistance of the transistor $T_4$, and slows down its de-energization. At a time indicated by the dashed line 27 in Fig. 2, however, the transistor $T_4$ is turned off. This open-circuits the collector of transistor $T_4$, and the lead 16 returns to a substantial negative voltage. A single brief output pulse 23 has thus been produced by the circuit of Fig. 1 in response to an input pulse 22 of indeterminate length.

Figure 3:
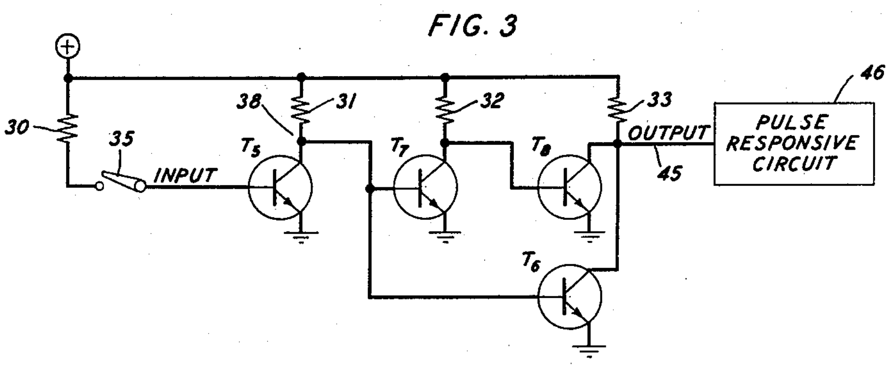
Fig. 3 is a schematic circuit of an alternative version of the circuit of Fig. 1.

Fig. 3 is an alternative version of the circuit of Fig. 1. In Fig. 3, the four transistors $T_5$ through $T_8$ are junction transistors of the NPN type. The collector voltages supplied through resistors 30, 31, 32, and 33 are therefore positive, as contrasted with the negative voltages employed with the PNP transistors in the embodiment of Fig. 1.

Figure 4:
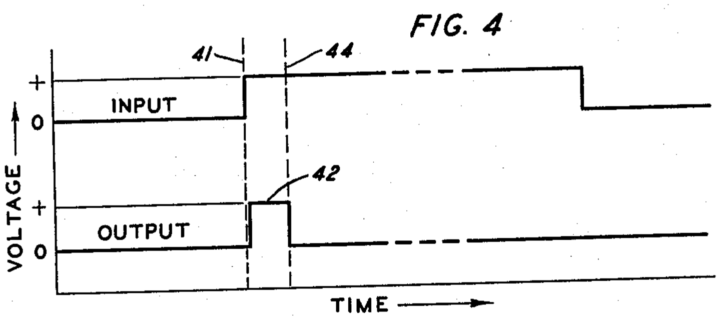
Fig. 4 is a graph of the input and output wave forms of the circuit of Fig. 3.

The transistor $T_5$ is maintained in its de-energized state when the switch 35 is open and the base is "floating." In the normal condition, with the input switch 35 open and transistor $T_5$ de-energized, transistor $T_8$ is also de-energized and transistors $T_6$ and $T_7$ are conducting. Closure of the switch 35 applies a positive voltage through resistor 30 to the base of transistor $T_5$. The energization of transistor $T_5$ has the effect of reducing the potential of point 38 nearly to ground potential. The transistor $T_6$, which is normally conducting, is promptly de-energized. Referring to Fig. 4, the closure of the switch 35 occurs at the time indicated by the vertical dashed line 41, and the transition indicated by the left-hand edge of the pulse 42 in Fig. 4 designates the instant of energization of the transistor $T_6$.

The transistor $T_7$ is considerably slower than transistor $T_6$ in becoming de-energized. The reason for this delay lies in the high value of collector resistance which is employed. The saturation of a transistor is dependent on the ratio of the base current to the collector current, and is a controlling factor in the turnoff time of the transistor. By increasing the collector resistance, the collector current is reduced, the saturation is substantially increased, and the transistor becomes slow in turning off. After a time interval represented by the space between the dashed lines 41 and 44 in Fig. 4, the transistor $T_7$ turns off and the transistor $T_8$ is promptly energized. The energization of transistor $T_8$ essentially short-circuits the output lead 45 to ground. This is indicated in Fig. 4 by the right-hand edge of the pulse 42.

Figure 5:
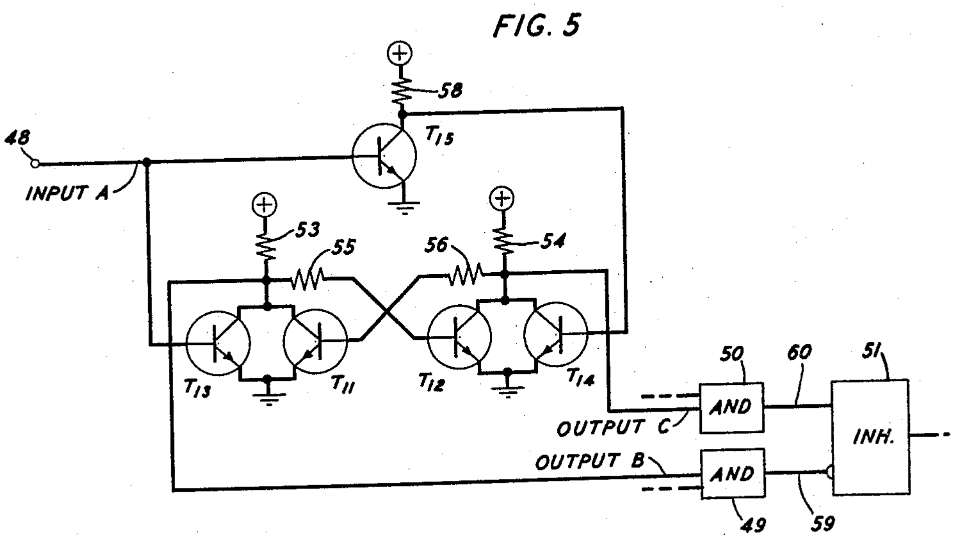
Fig. 5 is a circuit diagram of a multivibrator and associated control circuitry for changing the length of applied pulses.
Figure 6:
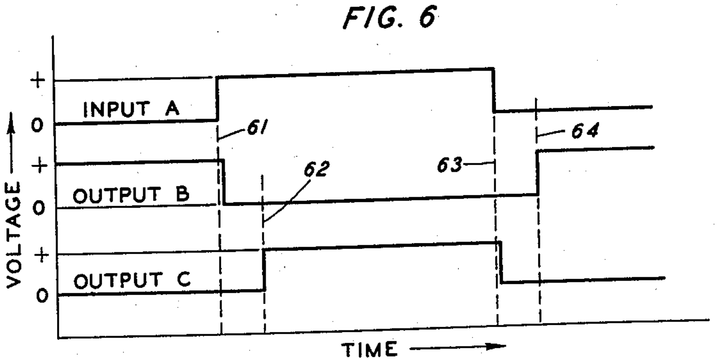
Fig. 6 is a graph of the pulse wave forms present at various points in the circuit of Fig. 5.

Fig. 5 is a circuit diagram of another direct coupled transistor logic circuit, and Fig. 6 shows wave forms at various indicated points in the circuit of Fig. 5. In Fig. 5, the transistor pulse circuit changes the input pulses applied to input lead A at terminal 48 into pulses suitable for application to the two AND units 49, 50 and ultimately, to the inhibit unit 51.

The transistor pulse circuit of Fig. 5 includes the five transistors $T_{11}$ through $T_{15}$. Transistors $T_{11}$ and $T_{12}$ constitute the active elements of a multivibrator. These transistors $T_{11}$ and $T_{12}$ are arranged in the common emitter circuit configuration which is characteristic of D.C.T.L. circuits, and they have their collectors and bases conductively cross-connected. When NPN transistors are employed, positive collector voltage is applied to the collector of each transistor. Collector voltage is applied to transistors $T_{11}$ and $T_{13}$ by resistor 53, and to the transistors $T_{12}$ and $T_{14}$ by resistor 54. It may be noted that the resistors 53 and 54 are relatively large in value so that transistors $T_{11}$ and $T_{12}$ are saturated when they are in the energized state. The cross-connection including resistor 55 from the collector of transistor $T_{11}$ supplies biasing current to the base of transistor $T_{12}$. Similarly, base current is supplied to transistor $T_{11}$ through resistors 54 and 56 when transistor $T_{12}$ is de-energized.

The transistors $T_{13}$ and $T_{14}$ have their collector-to-emitter circuits connected in parallel with those of transistors $T_{11}$ and $T_{12}$, respectively. Transistors $T_{13}$ and $T_{14}$ are control transistors which are employed to change the conduction state of the multivibrator circuit. $T_{15}$ is an inversion stage connected between the input terminal 48 and the control transistor $T_{14}$. Transistor $T_{15}$ is also arranged in the common emitter circuit configuration, and is supplied with collector current from a positive source of potential by the resistor 58. The resistor 58 is relatively small as compared with collector resistors 53 and 54, so that transistor $T_{15}$ draws more collector current, is unsaturated, and therefore may be de-energized rapidly.

The operation of the circuit of Fig. 5 in response to the application of a positive-going control pulse such as that indicated at A in Fig. 6 will now be considered. Initially, the input terminal 48 (and lead A) is at ground potential, the bases of transistors $T_{13}$ and $T_{15}$ are grounded, and these transistors are therefore de-energized. Base current is supplied to transistor $T_{12}$ from the circuit including resistors 53 and 55, and to transistor $T_{14}$ from the circuit including resistor 58. Transistors $T_{12}$ and $T_{14}$ are therefore energized. With the multivibrator in the state in which transistor $T_{11}$ is "off" and transistor $T_{12}$ is "on," the potential on lead B is high, and lead C is essentially at ground potential, as indicated by the portions of the plots to left of line 61 in Fig. 6.

When a positive-going pulse is applied to input terminal 48, however, the transistors $T_{13}$ and $T_{15}$ are energized nearly instantaneously. This has the effect of applying ground potential to the bases of transistors $T_{12}$ and $T_{14}$. As mentioned above, however, the resistor 54 s relatively large and produces saturation in transistors $T_{12}$ and $T_{14}$ when they are energized. As a result of this saturation, the time required for de-energization is significantly increased. Transistors $T_{12}$ and $T_{14}$ therefore do not turn off until a short period has elapsed after transistors $T_{11}$, $T_{13}$, and $T_{15}$ are energized. This is indicated in Fig. 6 by the time lag between the dashed line 61 aligned with the first transition in plots A and B, and the dashed line 62 corresponding to the transition point in plot C.

At the termination of the positive pulse applied to input terminal 48, ground potential is applied to the bases of transistors $T_{13}$ and $T_{15}$. Transistor $T_{15}$ is provided with a relatively small load resistor, is not saturated, and therefore is de-energized promptly. This enables transistor $T_{14}$, which is energized immediately. This is shown in Fig. 6 by the dashed line 63 marking the transitions in plots A and C. The slow de-energization of the saturated transistor $T_{13}$ is indicated in Fig. 6 by the time lag between the vertical dashed line 64 marking the second transition in plot B and the dashed line 63.

When control pulses are to be applied to an inhibit unit such as unit 51 in Fig. 5, it is desirable that the pulse applied to the inhibiting input lead 59 start before and terminate after the pulse applied to the normal input lead 60 to the inhibit unit. This is desirable in order to insure the inhibition of the entire pulse applied to the normal input of the inhibit unit.

In Fig. 6, the wave forms B and C represent the inputs to AND units 49 and 50, respectively. In addition, it may be noted that the wave form designated B overlaps the wave form C both in time of starting and in the time of completion. Accordingly, when both pulses are gated through the AND units 49 and 50, the inhibiting lead 59 to the inhibit unit 51 is energized by the longer pulse B which effectively blocks the shorter pulse C applied to the normal input terminal of the inhibit unit 51.

Concerning the parameters of the circuits of Figs. 1 through 3, the transistors may be either junction type (PNP or NPN as required), or surface barrier transistors. Suitable transistors are Western Electric type GA 52609 (an NPN alloy junction transistor), the Raytheon CK 761 (a PNP alloy junction transistor), or General Electric 4JD 1A–20 (a PNP alloy junction transistor).

Each of the circuits is operative over a wide range of supply voltages; for example, voltages from one-half volt to twelve volts have been employed. This wide variation is possible because the critical ratio of base-to-collector current remains substantially the same with variations of supply voltage. In general, it is desirable to supply the transistors with about four milliamperes of collector current. When a two volt supply is employed, collector resistors of 510 ohms may be employed. In the foregoing description of Figs. 1 through 3 where it is indicated that "relatively large" collector resistors should be employed to increase saturation, a value of about 4,000 ohms is suitable for use with the two volt supply. The foregoing specific transistor types and values of resistance are not critical and are given merely to illustrate one workable set of components which may be employed.

In the foregoing circuits, the delay in the de-energization of transistors in direct coupled transistor logic circuits has been controlled and utilized to produce temporary storage or delay. This is accomplished by energizing two signal circuits having different transistor delay from a common source. The output signals from these two circuits are employed to control operations requiring successive indications of the original control signal from the common source.

It is to be understood that the above-described arrangements are illustrative of the application of the principles of the invention. Numerous other arrangements may be devised by those skilled in the art without departing from the spirit and scope of the invention.

What is claimed is:

1. In a direct coupled transistor timing circuit, a multivibrator including first and second transistors having their bases and collectors resistively cross connected, a third transistor having its emitter and collector electrodes directly connected to the corresponding electrodes of said first transistor, a fourth transistor having its emitter and collector electrodes directly connected to the corresponding electrodes of said second transistor, an input circuit, means for coupling said input circuit directly to the base of said third transistor, and a fifth transistor in a common emitter circuit configuration connecting said input circuit to the base of said fourth transistor.

2. A combination as defined in claim 1 wherein means are provided for saturating the transistors in said multivibrator circuit to a greater extent than said fifth transistor.

3. A timing circuit for providing a first control pulse and a second control pulse which overlaps the first control pulse in point of time comprising a multivibrator including first and second transistors having their bases and collectors respectively cross-connected, a third transistor having its emitter and collector electrodes directly connected to the corresponding electrodes of said first transistor, a fourth transistor having its emitter and collector electrodes directly connected to the corresponding electrodes of said second transistor, an input circuit, means for coupling said input circuit directly to the base of said third transistor, a fifth transistor in a common emitter circuit configuration connecting said input circuit to the base of said fourth transistor, means for saturating the transistors in said multivibrator circuit to a greater extent than said fifth transistor, means for applying pulses to said input circuit, a load circuit, and means for coupling the overlapping control signals appearing at the collectors of said first and second transistors to said load circuit.

4. A direct-coupled common emitter transistor timing circuit comprising an input circuit, an output circuit, two branch control circuits each including at least one control transistor having its base connected to said input circuit, a bistable multivibrator comprising two transistors connected to be controlled by said branch circuits, circuit means for utilizing the output of said multivibrator to control said output circuit, and means for saturating one transistor in said multivibrator to a substantially greater extent than the other transistor in said multivibrator is saturated when said transistors are respectively energized.

5. A circuit as defined in claim 4 wherein a saturation control resistor is provided, and the base of one of said transistors in said multivibrator is connected through said resistor to the collector of the other of said transistors.

6. A circuit as defined in claim 4 including a source of potential and individual collector resistors of significantly different values, each of said resistors being connected between said source of potential and the collector electrodes of the transistors comprising said multivibrator.

7. A direct-coupled common emitter transistor pulse timing circuit comprising an output circuit having a predetermined normal state, means including first and second transistors for controlling the state of said output circuit, one of said transistors being normally enabled and the other being normally deenergized, and both of said transistors being connected to said output circuit, first and second resistors of significantly different values cross-coupling the collector and base electrodes of said first and second transistors, a third transistor, a control circuit interconnecting the collector of said third transsitor and the base of said second transistor, circuit means for providing saturated and unsaturated energized states, respectively, for two of said transistors, an input circuit, and a control circuit directly connecting said input circuit to the bases of both said first and third transistors.

8. A direct-coupled emitter transistor pulse timing circuit comprising a circuit including first and second control transistors, said transistors normally having predetermined conduction states with respect to each other, an input circuit, means for providing first and second paths cross-coupling the collector and base electrodes of said first and second control transistors, first and second branch circuits respectively connecting said input circuit to the bases of said first and second control transistors, the first of said branch circuits including at least one additional transistor, means including resistors severally having significantly different values of resistance connected to said first and second control transistors, said last-mentioned means allowing one of the transistors connected to said first branch circuit to saturate to a greater degree than one of the transistors connected to said second branch circuit while said transistors are respectively in the state of energization so that said first control transistor is delayed in obtaining its predetermined conduction state with respect to said second control transistor, and a common output circuit connected to each of said control transistors and operative only during the time before said transistors obtain said predetermined states.

9. A timing circuit of the direct-coupled transistor logic type comprising an input circuit, an output circuit, first and second branch control circuits each including at least one control transistor having its base connected to said input circuit, a bistable multivibrator comprising at least first and second transistors having their base and collector electrodes cross-coupled, said first and second transistors respectively connected to be controlled by said first and second branch control circuits, circuit means for connecting said output circuit to said first and second transistors, and means for saturating said first transistor to a substantially greater extent than said second transistor when said transistors are respectively energized to delay the application of signals from said first circuit to said output circuit with respect to the application of signals to said output circuit from said second branch circuit.

(References on following page)

References Cited in the file of this patent

UNITED STATES PATENTS

| | | |
|---|---|---|
| 2,421,340 | Levy | May 27, 1947 |
| 2,437,313 | Bedford | Mar. 9, 1948 |
| 2,572,080 | Wallace | Oct. 23, 1951 |
| 2,845,548 | Silliman et al. | July 29, 1958 |
| 2,846,594 | Pankratz et al. | Aug. 5, 1958 |
| 2,871,378 | Lohman | Jan. 27, 1959 |
| 2,905,815 | Goodrich | Sept. 22, 1959 |

FOREIGN PATENTS

| | | |
|---|---|---|
| 1,081,207 | France | June 9, 1954 |
| 1,114,488 | France | Dec. 19, 1955 |

OTHER REFERENCES

Beter, Bradley, Brown, and Rubinoff: "Surface-Barrier Transistor Switching Circuits," IRE Convention Record, part 4, March 21–24, 1955.

Beter, Bradley, Brown, and Rubinoff: "Directly Coupled Transistor Circuits," Electronics, June 1955.